(12) United States Patent
Schepis et al.

(10) Patent No.: US 11,233,137 B2
(45) Date of Patent: Jan. 25, 2022

(54) TRANSISTORS AND METHODS OF FORMING TRANSISTORS USING VERTICAL NANOWIRES

(71) Applicant: GLOBALFOUNDRIES U.S. Inc., Santa Clara, CA (US)

(72) Inventors: Dominic J. Schepis, Wappingers Falls, NY (US); Alexander Reznicek, Troy, NY (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 32 days.

(21) Appl. No.: 16/789,936

(22) Filed: Feb. 13, 2020

(65) Prior Publication Data

US 2020/0185510 A1 Jun. 11, 2020

Related U.S. Application Data

(62) Division of application No. 15/433,141, filed on Feb. 15, 2017, now Pat. No. 10,658,494.

(51) Int. Cl.
| | |
|---|---|
| *H01L 29/66* | (2006.01) |
| *H01L 29/49* | (2006.01) |
| *H01L 29/78* | (2006.01) |
| *H01L 29/06* | (2006.01) |
| *H01L 29/786* | (2006.01) |
| *H01L 29/423* | (2006.01) |
| *H01L 29/51* | (2006.01) |

(52) U.S. Cl.
CPC .... *H01L 29/66742* (2013.01); *H01L 29/0676* (2013.01); *H01L 29/42392* (2013.01); *H01L 29/4908* (2013.01); *H01L 29/517* (2013.01); *H01L 29/7827* (2013.01); *H01L 29/78642* (2013.01)

(58) Field of Classification Search
None
See application file for complete search history.

(56) References Cited

U.S. PATENT DOCUMENTS

| | | | |
|---|---|---|---|
| 8,932,940 B2 | 1/2015 | Wang et al. | |
| 9,385,195 B1 * | 7/2016 | Zhang | H01L 21/28008 |
| 9,525,064 B1 | 12/2016 | Balakrishnan et al. | |
| 9,570,552 B1 * | 2/2017 | Lee | B82Y 40/00 |
| 9,773,913 B1 | 9/2017 | Balakrishnan et al. | |
| 9,870,952 B1 | 1/2018 | Cheng et al. | |

(Continued)

FOREIGN PATENT DOCUMENTS

| | | |
|---|---|---|
| WO | 2010062644 A2 | 6/2010 |
| WO | 2011163262 A2 | 12/2011 |

*Primary Examiner* — Herve-Louis Y Assouman
(74) *Attorney, Agent, or Firm* — Thompson Hine LLP

(57) ABSTRACT

Devices and methods of fabricating vertical nanowires on semiconductor devices. A doped silicon substrate, a first insulator over the doped silicon substrate, a gate conductor over the first insulator, and a second insulator over the gate conductor. Silicon nanowires extend from the top surface of the substrate through the first insulator, the gate conductor, and the second insulator. A first contact extends from the gate conductor through the second insulator, a second contact extends from the substrate through the first insulator, the gate conductor, and the second insulator layer, and an insulating spacer material is positioned between the second contact and the gate conductor.

17 Claims, 8 Drawing Sheets

(56) References Cited

U.S. PATENT DOCUMENTS

| | | | |
|---|---|---|---|
| 2009/0035908 A1 | 2/2009 | Pribat et al. | |
| 2011/0012085 A1* | 1/2011 | Deligianni | H01L 29/0676 |
| | | | 257/9 |
| 2011/0233512 A1 | 9/2011 | Yang et al. | |
| 2012/0094192 A1* | 4/2012 | Qu | H01M 4/134 |
| | | | 429/336 |
| 2015/0137067 A1* | 5/2015 | Colinge | H01L 29/775 |
| | | | 257/9 |
| 2016/0181362 A1 | 6/2016 | Yang et al. | |
| 2017/0222045 A1* | 8/2017 | Leobandung | H01L 21/823487 |
| 2017/0345927 A1* | 11/2017 | Cantoro | H01L 29/7827 |

* cited by examiner

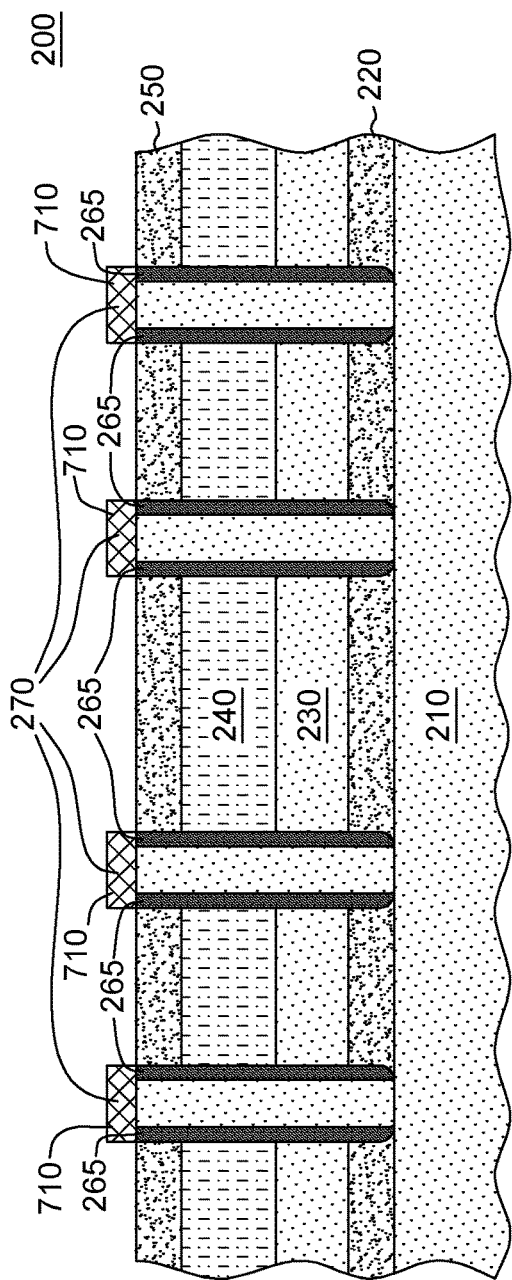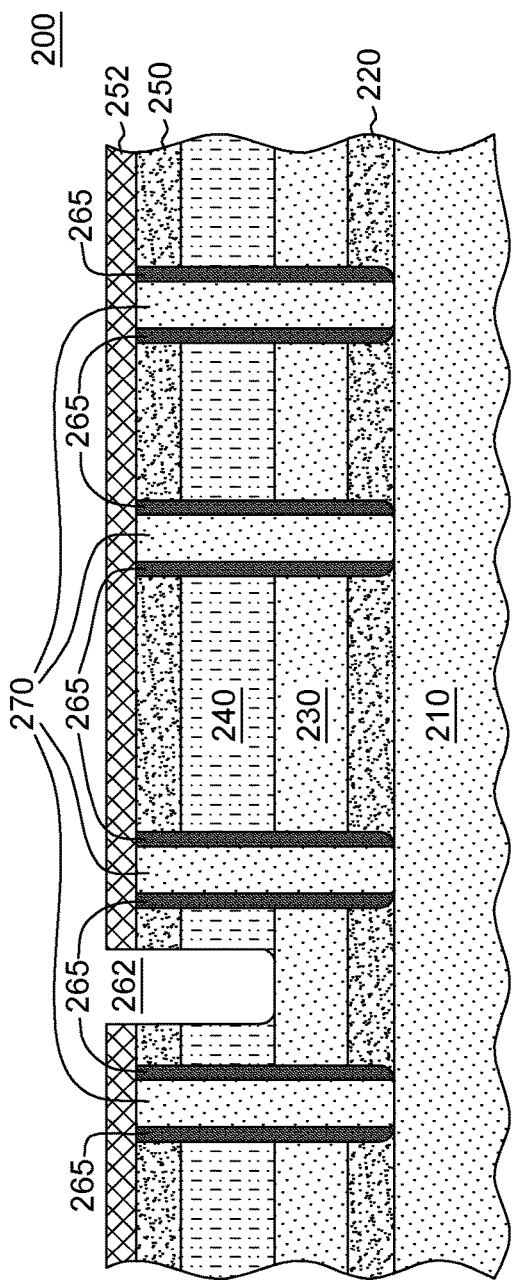

TRANSISTORS AND METHODS OF FORMING TRANSISTORS USING VERTICAL NANOWIRES

BACKGROUND

The present invention relates to semiconductor devices and methods of fabricating semiconductor devices, and more particularly, to transistors and methods of forming transistors using vertical nanowires for increased current density.

For 7 nm and beyond nodes, with the continually increasing demand for smaller circuit structures and faster device performance, the need for increased current density has resulted in the development of nanowires, which are small structures that can be packed tightly to increase the current density of a semiconductor device. However, typically the nanowires are horizontal, and thus limited in their ability to increase current density without a penalty to the area required, or each nanowire is an isolated feature.

Therefore, it may be desirable to develop methods of fabricating nanowires that are more tightly packed and which are easily manufactured and facilitate forming new transistors.

SUMMARY

The shortcomings of the prior art are overcome and additional advantages are provided through the provisions, in one aspect, a method that includes, for instance: obtaining an intermediate semiconductor device having a substrate, a first insulator disposed above the substrate, a material layer over the first insulator, a second insulator above the material layer, and a first hardmask; etching a plurality of vertical trenches through the hardmask, the first and second insulators, and the material layer; growing, epitaxially, a set of silicon nanowires from a bottom surface of the plurality of vertical trenches; etching a first set of vertical trenches to expose the material layer; etching a second set of vertical trenches to the substrate; depositing an insulating spacer material on a set of sidewalls of the first and second set of vertical trenches; and forming contacts in the first and second set of vertical trenches.

In another aspect, a device is provided which includes, for instance: a substrate, a first insulator disposed above the substrate, a material layer over the first insulator, a second insulator above the material layer, and a first hardmask; a set of silicon nanowires extending from a top surface of the substrate; a first set of contacts extending from a top surface of the gate conductor; a second set of contacts extending from the substrate; and an insulating spacer material lining a set of walls of the first and second set of contacts.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings.

FIG. 8 depicts the structure of FIG. 7 after forming a set of drain contacts on the top surface of the set of silicon nanowires, in accordance with one or more aspects of the present invention.

FIG. 9 depicts the structure of FIG. 7 after depositing a second hardmask and etching a first set of vertical trenches to the gate conductor, in accordance with one or more aspects of the present invention.

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Note also that reference is made below to the drawings, which are not drawn to scale for ease of understanding, wherein the same reference numbers used throughout different figures designate the same or similar components.

Generally stated, disclosed herein are certain integrated circuits, which provide advantages over the above noted, existing semiconductor devices and fabrication processes. Advantageously, the integrated circuit device fabrication processes disclosed herein provide for semiconductor devices with increased current density, increased area density, and utilizing shared contacts.

Figure 1:
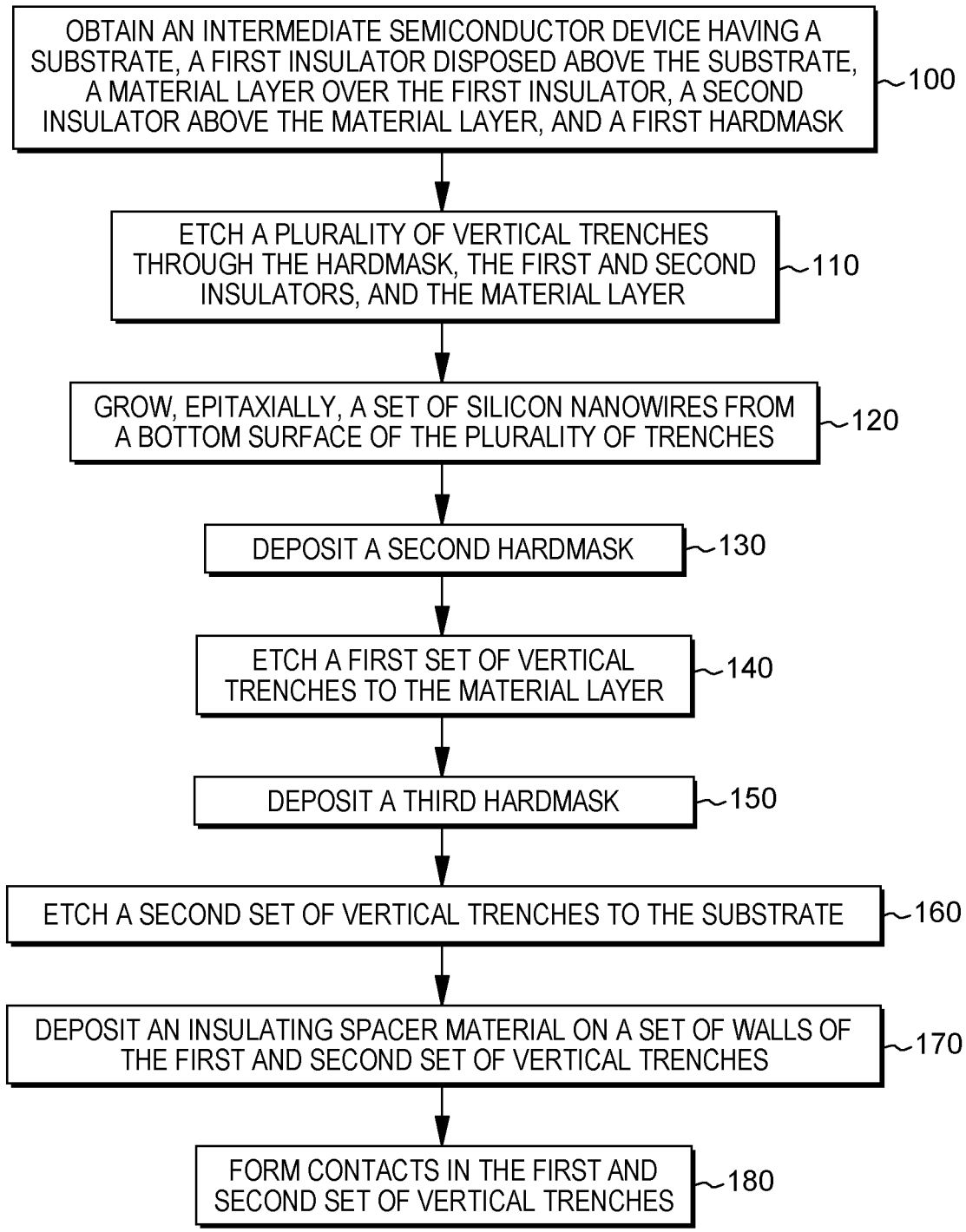
FIG. 1 depicts one embodiment of a method for forming an intermediate semiconductor structure, in accordance with one or more aspects of the present invention.

In one aspect, in one embodiment, as shown in FIG. 1, an integrated circuit device formation process in accordance with one or more aspects of the present invention may include, for instance: obtaining an intermediate semiconductor interconnect device having a substrate, a first insulator disposed above the substrate, a material layer suitable for a gate conductor over the first insulator, a second insulator above the material layer, and a first hardmask 100; etching a plurality of vertical trenches through the hardmask, the first and second insulators, and the material layer 110; growing, epitaxially, a set of silicon nanowires from a bottom surface of the plurality of trenches 120; depositing a second hardmask 130; etching a first set of vertical trenches to the material layer 140; depositing a third hardmask 150; etching a second set of vertical trenches to the substrate 160; depositing an insulating spacer material on a set of walls of the first and second set of vertical trenches 170; and forming contacts in the first and second set of vertical trenches 180.

FIGS. 2-13 depict, by way of example only, one detailed embodiment of a portion of a semiconductor device formation process and a portion of an intermediate semiconductor structure, in accordance with one or more aspects of the present invention. Note that these figures are not drawn to scale in order to facilitate understanding of the invention, and that the same reference numerals used throughout different figures designate the same or similar elements.

Figure 2:
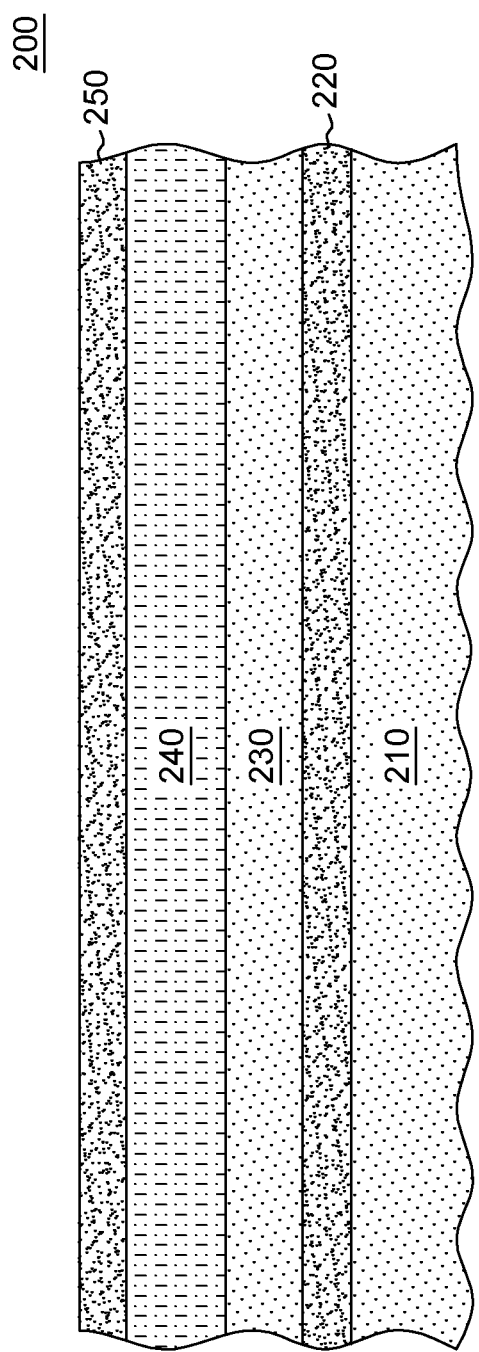
FIG. 2 depicts a cross-sectional elevation view of one embodiment of an intermediate semiconductor structure having a substrate a first insulator disposed above the substrate, a material layer over the first insulator, a second insulator above the material layer, and a first hardmask, in accordance with one or more aspects of the present invention.

FIG. 2 shows a portion of an intermediate semiconductor device generally denoted 200, depicted at an intermediate semiconductor fabrication stage. The device 200 may have been processed through initial device processing steps in accordance with the design of the device 200 being fabricated, and can include a variety of different wafers. The device 200 may include, for instance, a substrate 210. Substrate 210 may include a doped silicon material, and in some embodiments is as thick as a full silicon wafer, however in some embodiments is only approximately 50 to approximately 100 nanometers (nm) thick. The substrate 210 may be doped in order to form a source or a drain contact. Disposed on the substrate 210 is a first insulator 220. The first insulator can include a dielectric material, such as $SiO_2$. In embodiments where the first insulator material includes $SiO_2$, a prefabricated buried oxide (BOX) silicon-on-insulator (SOI) wafer may be used as the substrate and first insulator layer. Device 200 can also include a material layer 230, which can be formed into a gate conductor as described in later stages, over the first insulator 220. The material layer 230 may include amorphous silicon, polysilicon, or a high temperature metal, for instance, TiN. This layer may be approximately 25 nm to approximately 50 nm thick.

A second insulator 240, which may be of the same as or a different material from the first insulator 220, may be disposed above the material layer 230. In some embodiments, the second insulator 240 includes a dielectric material or an oxide material. Disposed above the second insulator 240 may be a first hardmask 250, which in some embodiments includes $Si_3N_4$ or other known mask materials.

Figure 3:
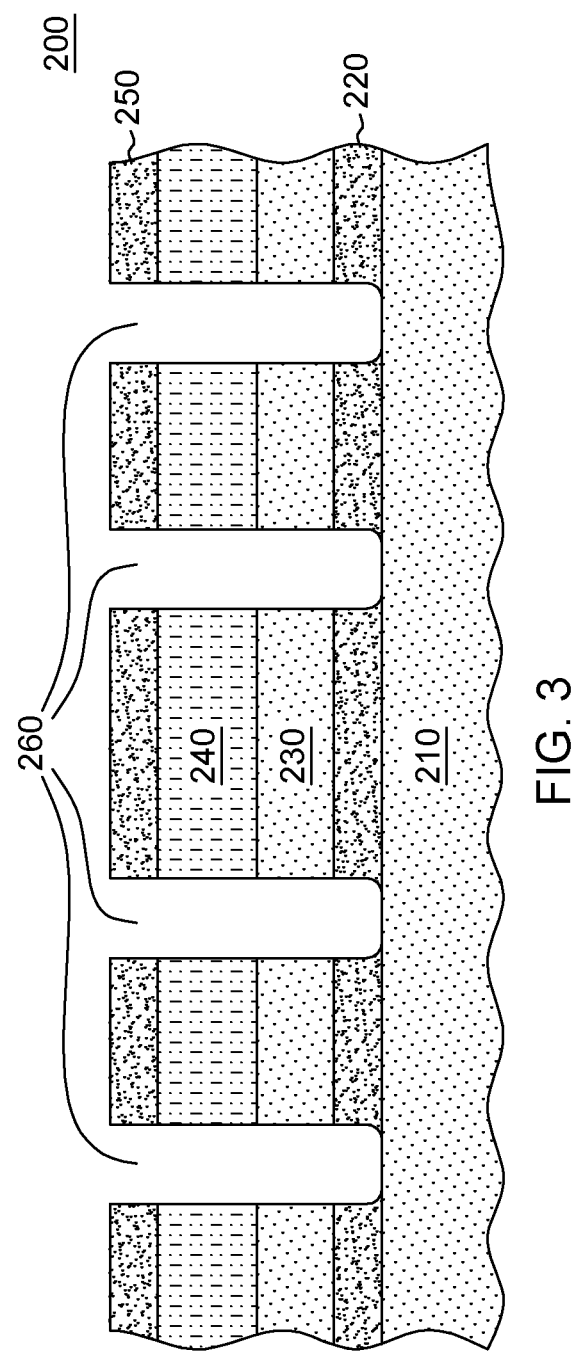
FIG. 3 depicts the structure of FIG. 2 after etching a plurality of vertical trenches, in accordance with one or more aspects of the present invention.

As depicted in FIG. 3, using lithography and etching processes, a plurality of vertical trenches 260 may be etched through the hardmask 250, the second insulator 240, the material layer 230, and the first insulator 220. Any number of trenches may be patterned and etched provided that the trenches are large enough to provide a current sufficient for a semiconductor device. The trenches may be etched, for example, using a directional reactive ion etching (ME). Although illustrated in FIG. 3 from the side as roughly rectangular pillar etches, these pillars may be approximately square as viewed from above (see 710 in FIG. 13), however the shape and size of the plurality of trenches 260 are not meant to be limited and can include any size, shape, or pattern of formation. However, the plurality of trenches must reach the substrate 210 in order to properly function electronically.

Figure 4:
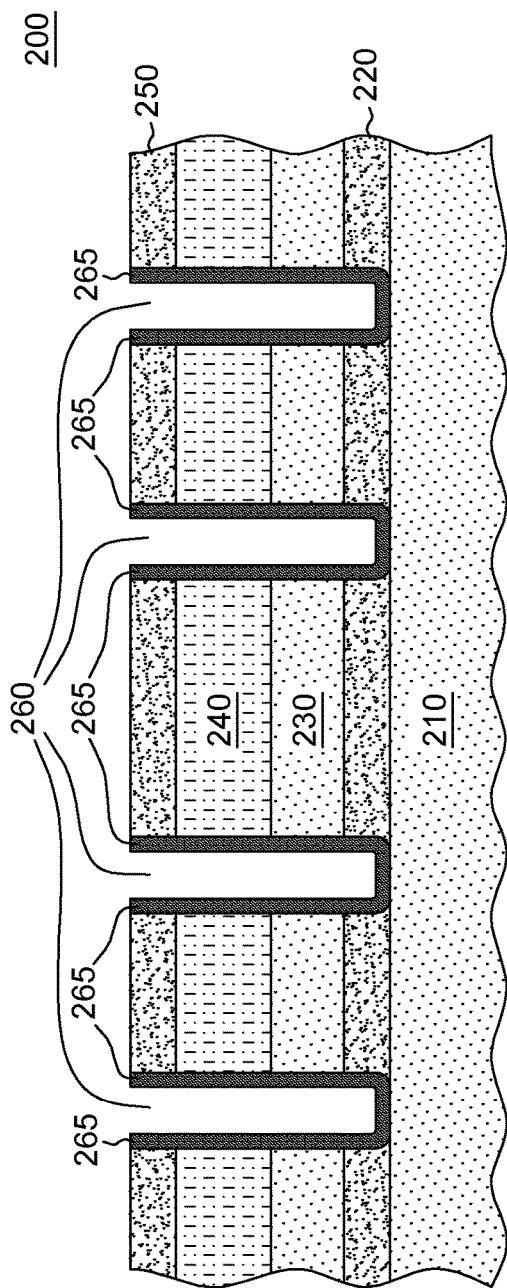
FIG. 4 depicts the structure of FIG. 3 after depositing a gate dielectric in the plurality of trenches, in accordance with one or more aspects of the present invention.

As depicted in FIG. 4, in some embodiments, a gate dielectric 265 may be deposited in the plurality of vertical trenches 260, lining the trenches. This gate dielectric 265 can include, for instance, $HfO_2$ and may be deposited using atomic layer deposition (ALD) techniques, or alternatively, chemical vapor deposition (CVD), physical vapor deposition (PVD), or any other suitable deposition technique now known or later developed for depositing a thin conformal layer.

Figure 5:
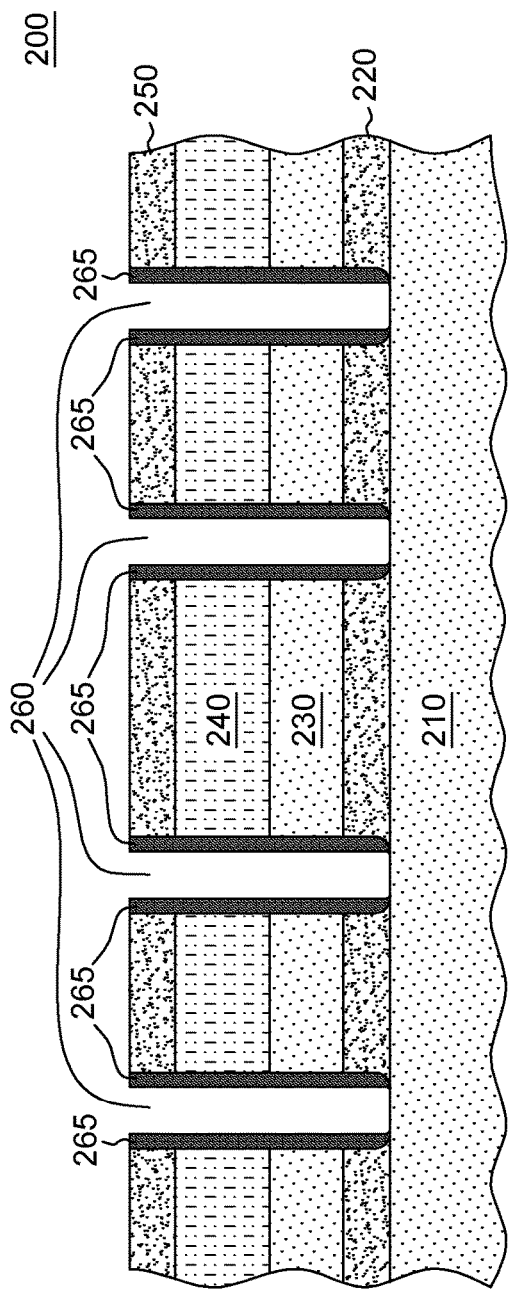
FIG. 5 depicts the structure of FIG. 4 after etching the gate dielectric in the plurality of trenches, in accordance with one or more aspects of the present invention.

As depicted in FIG. 5, following deposition of the gate dielectric 265, the plurality of vertical trenches 260 may be etched again in order to expose a top surface of the substrate 210. This etching, which may include ME, including using $CF_4$ for example, may also thin the gate dielectric 265 along the side walls, creating a more even lining.

Figure 6:
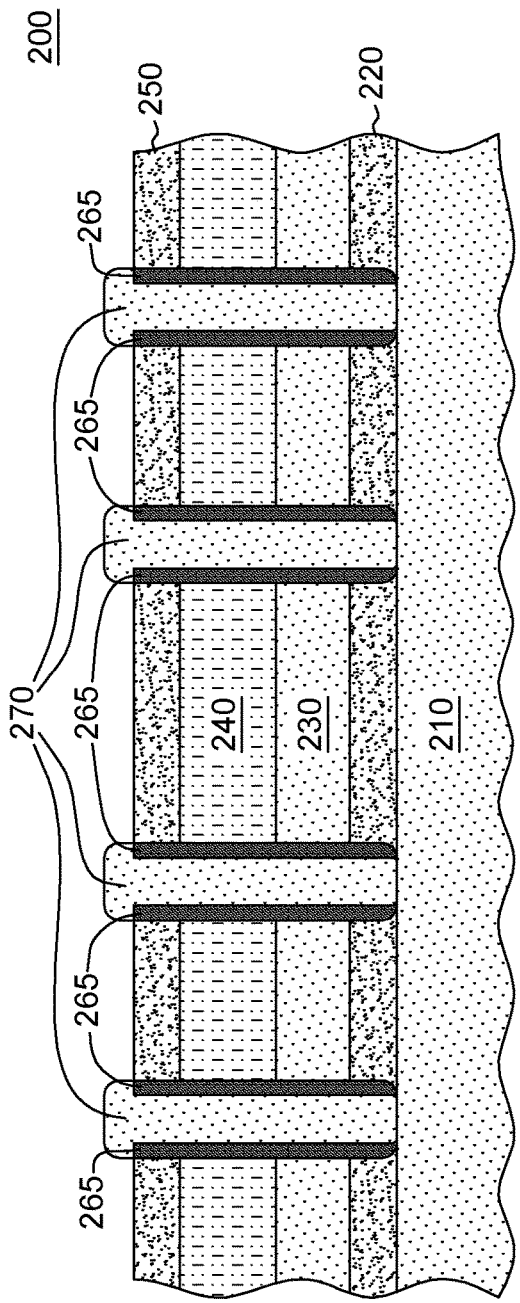
FIG. 6 depicts the structure of FIG. 5 after growing, epitaxially, a set of silicon nanowires from a bottom surface of the plurality of trenches, in accordance with one or more aspects of the present invention.

As depicted in FIG. 6, a set of silicon nanowires 270 can be grown from a bottom surface of the plurality of vertical trenches 260, which corresponds to the exposed top surface of the substrate 210. In some embodiments, the silicon nanowires are grown, epitaxially, from the substrate 210. The nanowires may include doped or undoped silicon, a silicon compound such as silicon germanium, or any appropriate semiconductor from groups III and V on the periodic table, for example. Additionally, rather than growing the silicon nanowires 270, amorphous silicon may be deposited in the plurality of vertical trenches 260, altering the mobility of electrons within the nanowires when used as part of a transistor.

Figure 7:
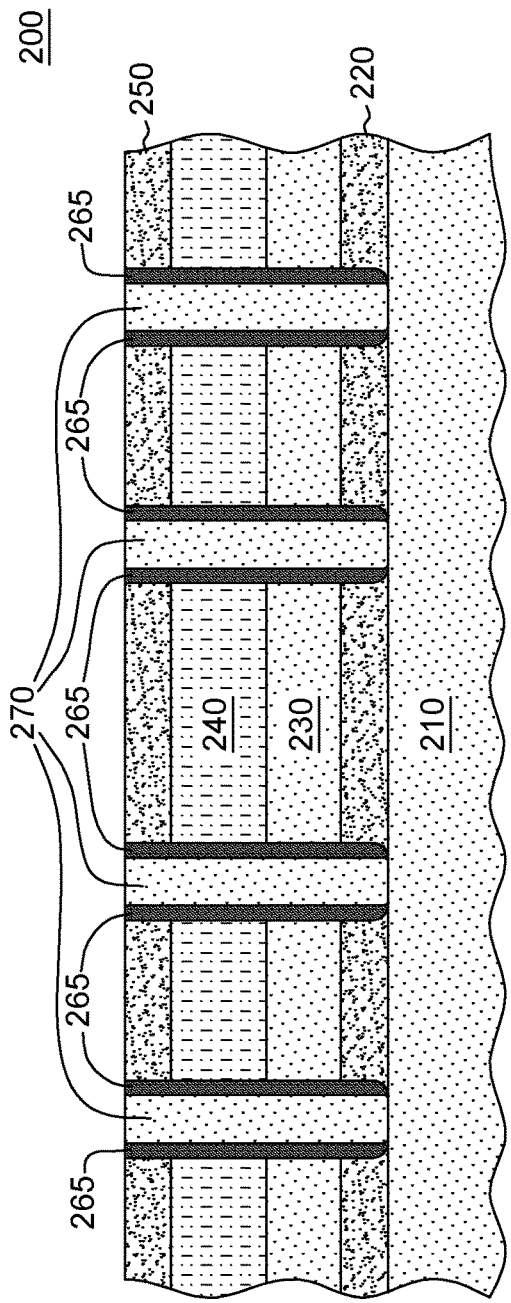
FIG. 7 depicts the structure of FIG. 6 after polishing a top surface of the set of silicon nanowires, in accordance with one or more aspects of the present invention.

As depicted in FIG. 7, depending on the desired device 200, in some embodiments, a top surface of the set of silicon nanowires 270 may be polished, for instance, by chemical mechanical polishing (CMP). In these embodiments, upon polishing device 200, a set of drain contacts 710 may be deposited, as depicted in FIG. 8, over the top surface of the set of silicon nanowires 270. In other embodiments, the set of drain contacts 710 may be formed later.

As depicted in FIG. 9, either after formation of drain contacts 710 or before, a second hardmask 252 may be deposited, which can include any lithography mask used for patterning and etching. Then, a first set of vertical trenches 262 may be patterned and etched through the second hardmask 252, the first hardmask 250, and the second insulator 240 to the material layer 230. While shown as reaching a top surface of the material layer 230, the first set of vertical trenches 262 may extend into the material layer 230. Any number of trenches may be etched. There may be only one trench if forming a single device, or there may be multiple trenches for a single device, or multiple devices may be formed at the same time, etching a plurality of trenches for the first set of vertical trenches 262. The second hardmask 252 may then be removed in some embodiments.

Figure 10:
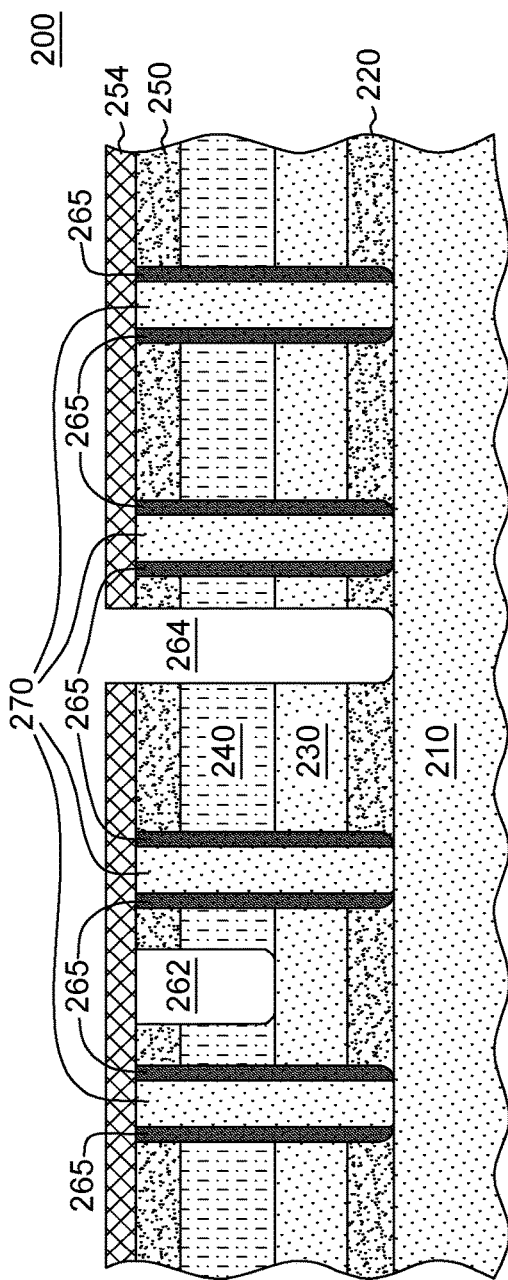
FIG. 10 depicts the structure of FIG. 9 after depositing a third hardmask and etching a second set of vertical trenches to the substrate, in accordance with one or more aspects of the present invention.

As depicted in FIG. 10, following etching and removal of the second hardmask 252, a photoresist mask 254 may be deposited, which can include any photoresist mask used for patterning and etching. Then, a second set of vertical trenches 264 may be patterned and etched through the photoresist mask 254, the first hardmask 250, the second insulator 240, the material layer 230, the first insulator 220, and to the substrate 210. While shown as reaching a top surface of the substrate 210, the second set of vertical trenches 264 may extend into the substrate 210. Any number of trenches may be etched. There may be only one trench if forming a single device, or there may be multiple trenches for a single device, or multiple devices may be formed at the same time, etching a plurality of trenches for the second set of vertical trenches 264.

Figure 11:
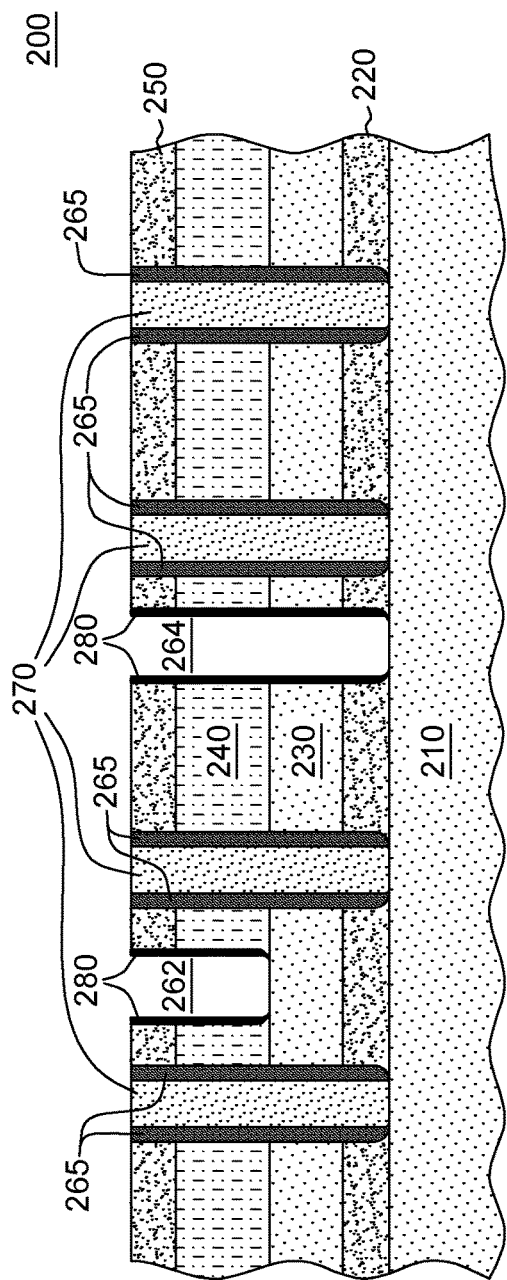
FIG. 11 depicts the structure of FIG. 10 after depositing an insulating spacer material on a set of walls of the first and second set of vertical trenches, in accordance with one or more aspects of the present invention.

As depicted in FIG. 11, the photoresist mask 254 can be removed and an insulating spacer material 280 may be deposited on a set of walls of the first set of vertical trenches 262 and the second set of vertical trenches 264. The spacer material 280 can include an oxide or a nitride material which will insulate the walls and create a clean contact to the material layer 230 and the substrate 210, respectively. This insulating spacer material 280 may be deposited using ALD or CVD. The spacer may be, for example, between approximately 20 nm and approximately 50 nm thick.

Figure 12:
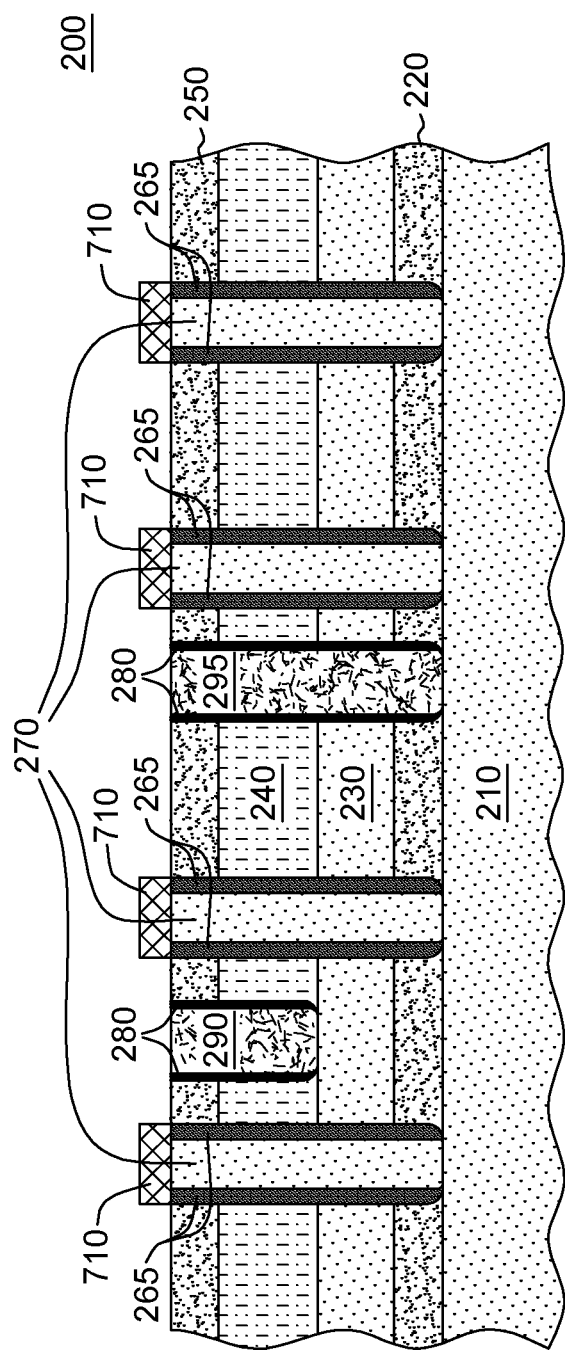
FIG. 12 depicts the structure of FIG. 11 after forming contacts in the first and second set of vertical trenches and forming a set of drain contacts on the top surface of the set of silicon nanowires, in accordance with one or more aspects of the present invention.

As depicted in FIG. 12, contacts to the material layer 320 acting as a gate conductor and substrate 210 (working as source) may then be formed. The set of drain contacts 710 may have been previously formed, or can now be formed simultaneously with the contacts to the gate conductor and substrate 210. A first set of contacts 290 may be formed in the first set of vertical trenches 262, forming gate contacts by contacting the material layer 230. As previously stated, there may be one or more than one gate contact formed for each device fabricated. A second set of contacts 295 may be formed in the second set of vertical trenches 264, forming a set of source contacts by contacting the substrate 210. Again, one or more than one source contact can be formed. Any or all of these contacts can include any contact material now known or later developed, including for example, tungsten.

Figure 13:
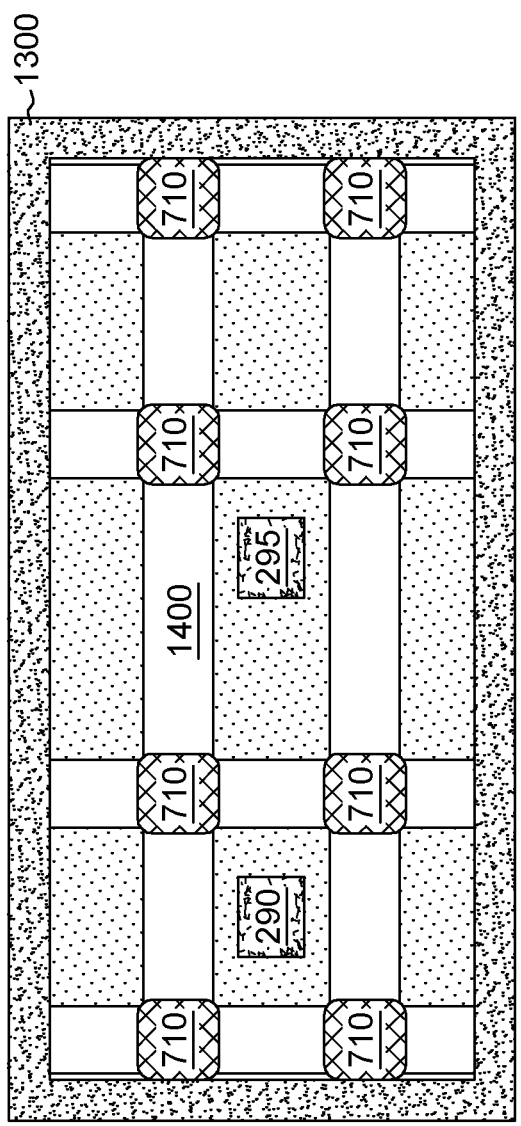
FIG. 13 depicts a top-down view of the structure of FIG. 12, after forming a moat around at least some of the set of silicon nanowires.

As depicted in FIG. 13, a moat 1300 may be formed around at least some of the set of silicon nanowires 270. Moat 1300 may be formed using shallow trench isolation (STI) techniques or deep trench isolation (DTI) techniques. This may be done at any point in the manufacturing of device 200. In order to form the moat 1300, a trench is etched deep into the substrate 210, and an insulator material is deposited into the trench. Alternatively, the moat can be formed by a plurality of lines 1400 which can be patterned around each nanowire, essentially forming a single nanowire moat so that each nanowire is independently controlled. Any number of nanowires may be included within the moat. Thus, depending on the amount of current needed, a device 200 will activate every nanowire contained within the moat, due to the vertical nanowires sharing gate and source contacts. Therefore, a device 200 can be patterned and formed with a plurality of nanowires sharing a single source, and activated all together, or a plurality of devices 200 may be formed simultaneously with multiple nanowires sharing a source, so that an entire wafer can be patterned at the same time, using the method above to separate out distinct devices. While shown in a grid pattern in FIG. 13, it should be understood that the set of silicon nanowires 270 under drain contacts 710 may be in a different pattern, and those farther from the first and second set of contacts 290 and 295 may be closer together. The contacts require some spacing of nanowires, but the rest of the nanowires can be closer together, allowing for higher current density of structures.

It should be appreciated that the novel intermediate semiconductor devices and methods of forming the same disclosed above allow for many wires to be close together and operated by a shared source. According to embodiments, this can allow for higher current density than previously possible, and can be fabricated in a larger scale due to the techniques used.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A semiconductor device comprising:
   a doped silicon substrate having a top surface;
   a first insulator over the doped silicon substrate;
   a gate conductor over the first insulator;
   a second insulator over the gate conductor;
   a plurality of silicon nanowires extending from the top surface of the doped silicon substrate through the first insulator, the gate conductor, and the second insulator;
   a first contact extending from the gate conductor through a first vertical trench in the second insulator, the first vertical trench including a first set of walls;
   a second contact extending from the doped silicon substrate through a second vertical trench in the first insulator, the gate conductor, and the second insulator, the second vertical trench including a second set of walls;
   a first insulating spacer material on the first set of walls of the first vertical trench, the first insulating spacer material positioned between the first contact and the second insulator; and
   a second insulating spacer material on the second set of walls of the second vertical trench, the second insulating spacer material positioned between the second contact and the first insulator, between the second contact and the gate conductor, and between the second contact and the second insulator.

2. The semiconductor device of claim 1 wherein the plurality of silicon nanowires extend above the second insulator.

3. The semiconductor device of claim 2 further comprising:
a hardmask over the second insulator,
wherein the plurality of silicon nanowires extend through the hardmask.

4. The semiconductor device of claim 3 further comprising:
a plurality of third contacts over the hardmask, each of the plurality of third contacts connected with one of the plurality of silicon nanowires.

5. The semiconductor device of claim 1 wherein the doped silicon substrate provides a source of the semiconductor device.

6. The semiconductor device of claim 1 wherein the doped silicon substrate provides a drain of the semiconductor device.

7. The semiconductor device of claim 1 wherein the first insulator is a buried oxide of a silicon-on-insulator wafer.

8. The semiconductor device of claim 1 wherein the first insulator or the second insulator comprises $SiO_2$.

9. The semiconductor device of claim 1 wherein the gate conductor is amorphous silicon, polysilicon, or TiN.

10. The semiconductor device of claim 4 wherein the gate conductor is approximately 25 nm to approximately 50 nm thick.

11. The semiconductor device of claim 1 further comprising:
a gate dielectric positioned between each of the plurality of silicon nanowires and the gate conductor.

12. The semiconductor device of claim 11 wherein the gate dielectric comprises $HfO_2$.

13. The semiconductor device of claim 11 wherein the gate dielectric is positioned between each of the plurality of silicon nanowires and the first insulator.

14. The semiconductor device of claim 13 wherein the gate dielectric is positioned between each of the plurality of silicon nanowires and the second insulator.

15. The semiconductor device of claim 1 further comprising:
a plurality of third contacts, each of the plurality of third contacts arranged on a top surface of one of the plurality of silicon nanowires.

16. The semiconductor device of claim 1 wherein the gate conductor has a top surface, and the first contact extends from the top surface of the gate conductor through the second insulator.

17. The semiconductor device of claim 1 wherein the second contact extends from the top surface of the doped silicon substrate through the first insulator, the gate conductor, and the second insulator.

* * * * *